United States Patent
Osswald et al.

(10) Patent No.: US 12,301,032 B2
(45) Date of Patent: May 13, 2025

(54) METHOD FOR DETECTING ELECTRICAL FAULT STATES IN A REMOVABLE BATTERY PACK AND SYSTEM FOR CARRYING OUT THE METHOD

(71) Applicant: Robert Bosch GmbH, Stuttgart (DE)

(72) Inventors: Alexander Osswald, Stuttgart (DE); Christoph Klee, Stuttgart (DE); Mickael Segret, Stuttgart (DE); Juergen Mack, Goeppingen (DE); Marc-Alexandre Seibert, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 875 days.

(21) Appl. No.: 17/382,740

(22) Filed: Jul. 22, 2021

(65) Prior Publication Data

US 2022/0029433 A1 Jan. 27, 2022

(30) Foreign Application Priority Data

Jul. 24, 2020 (DE) ...................... 10 2020 209 396.2

(51) Int. Cl.
*H02J 7/00* (2006.01)
*G01K 3/00* (2006.01)
*G01R 31/374* (2019.01)

(52) U.S. Cl.
CPC ............ *H02J 7/0031* (2013.01); *G01K 3/005* (2013.01); *G01R 31/374* (2019.01);
(Continued)

(58) Field of Classification Search
CPC .............. H02J 7/00034; H02J 7/00032; H02J 7/00036; H02J 7/00045; H02J 7/00047; H02J 7/0063; H02J 7/0071; H02J 7/007192; H02J 7/007194; H02J 2310/22; H02J 7/0031; H02J 7/0013; H02J 7/0047; B60L 53/65; B60L 53/66; H01M 10/4257;
(Continued)

(56) References Cited

U.S. PATENT DOCUMENTS 10,476,278 B2 * 11/2019 Yip ..................... H02J 7/00045
2002/0149346 A1 10/2002 Sakakibara
(Continued)

FOREIGN PATENT DOCUMENTS

DE 10 2016 209 822 A1 12/2017
EP 3 373 382 A1 9/2018
WO 2020/043386 A1 3/2020

*Primary Examiner* — Nathaniel R Pelton
(74) *Attorney, Agent, or Firm* — Maginot, Moore & Beck LLP

(57) ABSTRACT

A method detects electrical fault states of at least one energy storage cell of a removable battery pack using a first monitoring unit integrated in the removable battery pack and at least two temperature sensors integrated in the removable battery pack. In an electrical device, in particular a charging device, a diagnostic device or an electrical consumer, that can be electrically connected to the removable battery pack, a measured temperature of a first of the at least two temperature sensors is evaluated by a further monitoring unit of the electrical device and, essentially simultaneously, another measured temperature of a second of the at least two temperature sensors is evaluated by the first monitoring unit of the removable battery pack.

12 Claims, 3 Drawing Sheets

(52) U.S. Cl.
CPC ........ *H02J 7/00032* (2020.01); *H02J 7/0013* (2013.01); *H02J 7/0047* (2013.01); *H02J 7/007194* (2020.01)

(58) Field of Classification Search
CPC ........ H01M 10/486; H01M 2010/4278; H03F 3/183; H03F 2200/03; H04R 1/02; H04R 2201/028; G01R 31/00; G01R 31/374
USPC .................................................. 320/131, 150
See application file for complete search history.

(56) References Cited

U.S. PATENT DOCUMENTS

| | | | | |
|---|---|---|---|---|
| 2010/0085018 A1* | 4/2010 | Cruise | ................. | H01M 50/296 |
| | | | | 320/150 |
| 2010/0090652 A1* | 4/2010 | Takeda | ................. | H01M 10/486 |
| | | | | 320/134 |
| 2012/0056587 A1* | 3/2012 | Lida | ................... | H01M 10/443 |
| | | | | 320/134 |
| 2015/0200553 A1* | 7/2015 | Endo | ..................... | H02J 7/0047 |
| | | | | 320/134 |
| 2021/0288356 A1* | 9/2021 | Tsutsui | ................ | H01M 10/445 |

* cited by examiner

METHOD FOR DETECTING ELECTRICAL FAULT STATES IN A REMOVABLE BATTERY PACK AND SYSTEM FOR CARRYING OUT THE METHOD

This application claims priority under 35 U.S.C. § 119 to patent application no. DE 10 2020 209 396.2, filed on Jul. 24, 2020 in Germany, the disclosure of which is incorporated herein by reference in its entirety.

The disclosure relates to a method for detecting electrical fault states of at least one energy storage cell of a removable battery pack by means of a first monitoring unit integrated in the removable battery pack and at least two temperature sensors integrated in the removable battery pack. The disclosure further relates to a removable battery pack and to a system for carrying out the method.

BACKGROUND

A multiplicity of electrical consumers are operated using battery packs that can be removed without tools by the operator—referred to as removable battery packs in the following text—and that are discharged accordingly by the electrical consumer and can be recharged again by means of a charging device. Such removable battery packs usually consist of a plurality of energy storage cells interconnected in series and/or in parallel for achieving a requested removable battery pack voltage or capacity. If the energy storage cells are designed as lithium-ion cells (Li-ion), for example, a high power and energy density can particularly advantageously be achieved. On the other hand, to prevent electrical fault states, such cells also require compliance with strict specifications regarding the maximum charging and discharge current, the voltage and the temperature.

In modern removable battery packs, the cell voltage of the parallel-connected energy storage cells of what is known as a cell cluster is evaluated, for example, by a monitoring unit integrated in the removable battery pack. The term "cell voltage" should accordingly be understood not only as the voltage of an individual energy store cell but also that of a cell cluster consisting of parallel-interconnected energy storage cells. So-called single cell monitoring (SCM) of this type is known, for example, from WO 20043386 A1, in which dangerous operation of the removable battery pack in the event of a fault is precluded by redundant monitoring.

In order for a charging device or an electrical consumer to know with which charging or discharge current a removable battery pack may be operated at a maximum, this is generally communicated by electrical coding, for example by coding resistors integrated in the removable battery pack that are measured by the electrical device and compared with a stored table, mechanical coding or a communication interface. DE 10 2016 209 822 A1 likewise discloses that the electrical device communicates to the removable battery pack that it may not continue to be used. The cell voltages can also be transmitted to the device via such an interface.

Proceeding from the prior art, it is the object of the disclosure to achieve reliable temperature measurement in a removable battery pack and to ensure a safe charging or discharging process in a manner dependent thereon.

SUMMARY

According to the disclosure, provision is made, in a method step, in an electrical device, in particular a charging device, a diagnostic device or an electrical consumer, that can be electrically connected to the removable battery pack, for the measured temperature of a first of the at least two temperature sensors to be evaluated by a further monitoring unit of the electrical device and essentially simultaneously, in a method step, for the measured temperature of a second of the at least two temperature sensors to be evaluated by the first monitoring unit of the removable battery pack. The use of a further temperature sensor in the removable battery pack affords the advantage that it is independent of the first temperature sensor and that the temperature measurement by means of the first temperature sensor that is initiated by the further monitoring unit of the electrical device cannot be falsified by the first monitoring unit of the removable battery pack. In addition, the disclosure can prevent a high degree of outlay that would be necessary for preventing said falsification.

"Essentially simultaneously" is intended to be understood as meaning that short time differences can occur between the method steps. In this case, the order does not matter. For example, upon the removable battery pack being plugged into the electrical device, the temperature measurement can thus be initiated in parallel by the first and the further monitoring unit. It is likewise conceivable that the further monitoring unit carries out the temperature measurement before the first monitoring unit and vice versa. In order to prevent temperature differences due to measurements too far apart from one another in terms of time using the two temperature sensors, the measurements should, however, be carried out "essentially simultaneously", that is to say with a maximum time offset of one to two seconds.

In the context of the disclosure, electrical consumers should be understood to mean, for example, power tools operated using a removable battery pack for performing work on workpieces by means of an electrically driven insert tool. The power tool may in this case be realized both as a hand-held power tool and as a floor-standing power tool. Typical power tools in this context are hand-held or floor-standing drills, screwdrivers, impact drills, hammer drills, planers, angle grinders, orbital sanders, polishing machines, circular, bench, miter and jigsaws or the like. However, gardening appliances operated using a removable battery pack such as lawn mowers, lawn trimmers, pruning saws or the like and also domestic appliances operated using a removable battery pack such a vacuum cleaners, mixers, etc., may also be included under the term electrical consumer. The disclosure can likewise be applied to electrical consumers that are supplied with power using a plurality of removable battery packs simultaneously.

The voltage of a removable battery pack is generally a multiple of the voltage of an individual energy storage cell and results from the interconnection (in parallel or in series) of the individual energy storage cells. An energy storage cell is typically designed as a galvanic cell, which has a structure in which one cell pole comes to lie at one end and a further cell pole comes to lie at an opposite end. In particular, the energy storage cell at one end has a positive cell pole and at an opposite end a negative cell pole. The energy storage cells are preferably designed as lithium-based energy storage cells, for example Li-ion, Li—Po, Li-metal or the like. However, the disclosure can also be applied to removable battery packs with Ni—Cd, Ni-MH cells or other suitable cell types. In current Li-ion energy storage cells with a cell voltage of 3.6 V, for example voltage classes of 3.6 V, 7.2 V, 10.8 V, 14.4 V, 18 V, 36 V etc. are produced. An energy storage cell is preferably designed as an at least substantially cylindrical round cell, wherein the cell poles are arranged at ends of the cylinder shape. However, the disclosure is not dependent on the type and construction of the energy storage cells used but can applied to any removable battery packs and energy storage cells, for example also pouch cells or the like in addition to round cells.

It should furthermore be noted that the configuration of the electromechanical interfaces of the removable battery packs and the electrical devices that can be connected thereto and also the associated receptacles for force-fitting and/or form-fitting releasable connection are not intended to be the subject of this disclosure. A person skilled in the art will select a suitable embodiment for the interface depending on the power or voltage class of the electrical device and/or the removable battery pack. The embodiments shown in the drawings are therefore to be understood as purely exemplary. It is thus possible, in particular, to also use interfaces having more than the illustrated electrical contacts.

In another configuration of the disclosure, provision is made, in a subsequent method step, for the temperature evaluated by the first monitoring unit of the removable battery pack to be transmitted to the second monitoring unit of the electrical device. Subsequently, the temperature values are evaluated by the second monitoring unit in a subsequent method step and the charging or discharge current of the removable battery pack is adapted in a manner dependent thereon. In this way, the specifications of the energy storage cells can be better complied with based on the two temperature values. Provision can additionally be made here for the charging or discharge current of the removable battery pack to be adapted to that of the evaluated temperature values, according to which the respectively lower charging or discharge current is permissible.

Another configuration of the disclosure makes provision, in a subsequent method step, for the charging or discharging process of the removable battery pack to be interrupted and/or for a fault state to be displayed when the evaluated temperature values differ by more than a first temperature threshold value, in particular by more than 10 kelvin. This makes it possible to react to local temperature differences between the energy storage cells of the removable battery pack that could not be detected using a single temperature sensor.

Provision can further be made, in a method step, for the first temperature sensor to be disconnected from a reference potential, in particular a ground potential, by the first monitoring unit via a switching element integrated in the removable battery pack when the measured temperature of the second temperature sensor has exceeded a further temperature threshold value, in particular 60° C. The disconnection of the first temperature sensor can advantageously be detected by the further monitoring unit in the electrical device, with the result that said monitoring unit for its part terminates or interrupts the charging or discharging process of the removable battery pack and/or displays a corresponding fault state on the electrical device.

Additionally, in a subsequent method step, a piece of information about the disconnection of the first temperature sensor by the reference potential is transmitted from the first monitoring unit to the further monitoring unit of the electrical device such that the charging or discharging process of the removable battery pack is terminated or interrupted by the further monitoring unit and/or a fault state is displayed. A redundant piece of information about a possible fault case in the removable battery pack is thus available to the electronic device.

The disclosure also relates to a system comprising a removable battery pack having a first monitoring unit, at least two temperature sensors and a first electromechanical interface having a plurality of electrical contacts, and also an electrical device, in particular a charging device, a diagnostic device or an electrical consumer, having a further evaluation unit and a further electromechanical interface having a plurality of electrical contacts, wherein in each case a first of the electrical contacts of the interfaces is designed as an energy supply contact that can be supplied with a first reference potential, preferably a supply potential, in each case a second of the electrical contacts of the interfaces is designed as an energy supply contact that can be supplied with a second reference potential, preferably a ground potential, in each case a third of the electrical contacts of the interfaces is designed as a signal or data contact for data exchange of the first and the further monitoring unit and in each case a fourth of the electrical contacts of the interfaces is designed as a signal or data contact for transmission of a temperature signal of one of the temperature sensors to the further monitoring unit of the electrical device. The electrical contacts of the first and the further interface are connected to one another in order to carry out the method according to the disclosure.

In another configuration, provision is made for the removable battery pack to have a switching element, which in the closed state connects a first of the temperature sensors to the second reference potential of the second energy supply contact and in the open state disconnects it therefrom.

Finally, the disclosure also relates to a removable battery pack having at least one energy storage cell, a monitoring unit, a first temperature sensor, and an electromechanical interface, having a plurality of electrical contacts, for connection to an electrical device, in particular a charging device, a diagnostic device or an electrical consumer, wherein a first of the electrical contacts of the interface is designed as an energy supply contact that can be supplied with a first reference potential, preferably a supply potential, a second of the electrical contacts of the interface is designed as an energy supply contact that can be supplied with a second reference potential, preferably a ground potential, a third of the electrical contacts of the interface is designed as a signal or data contact of the first monitoring unit and a fourth of the electrical contacts of the interface for monitoring the at least one energy store cell is designed as a signal and/or. Provision is made for the removable battery pack to have at least one further temperature sensor, which is connected to the monitoring unit.

The further temperature sensor is used to monitor the at least one energy storage cell and/or further energy storage cells that are electrically connected to the at least one energy storage cell. The monitoring unit controls a switching element of the removable battery pack in such a way that in the closed state it connects a first of the temperature sensors to the second reference potential of the second energy supply contact and in the open state disconnects it therefrom. This results in the advantages of the method according to the disclosure that are described further above.

BRIEF DESCRIPTION OF THE DRAWINGS

The disclosure is explained by way of example in the following text based on FIGS. 1 to 3, wherein identical reference signs in the figures indicate identical component parts with an identical function.

In the drawings.

DETAILED DESCRIPTION

Figure 1:
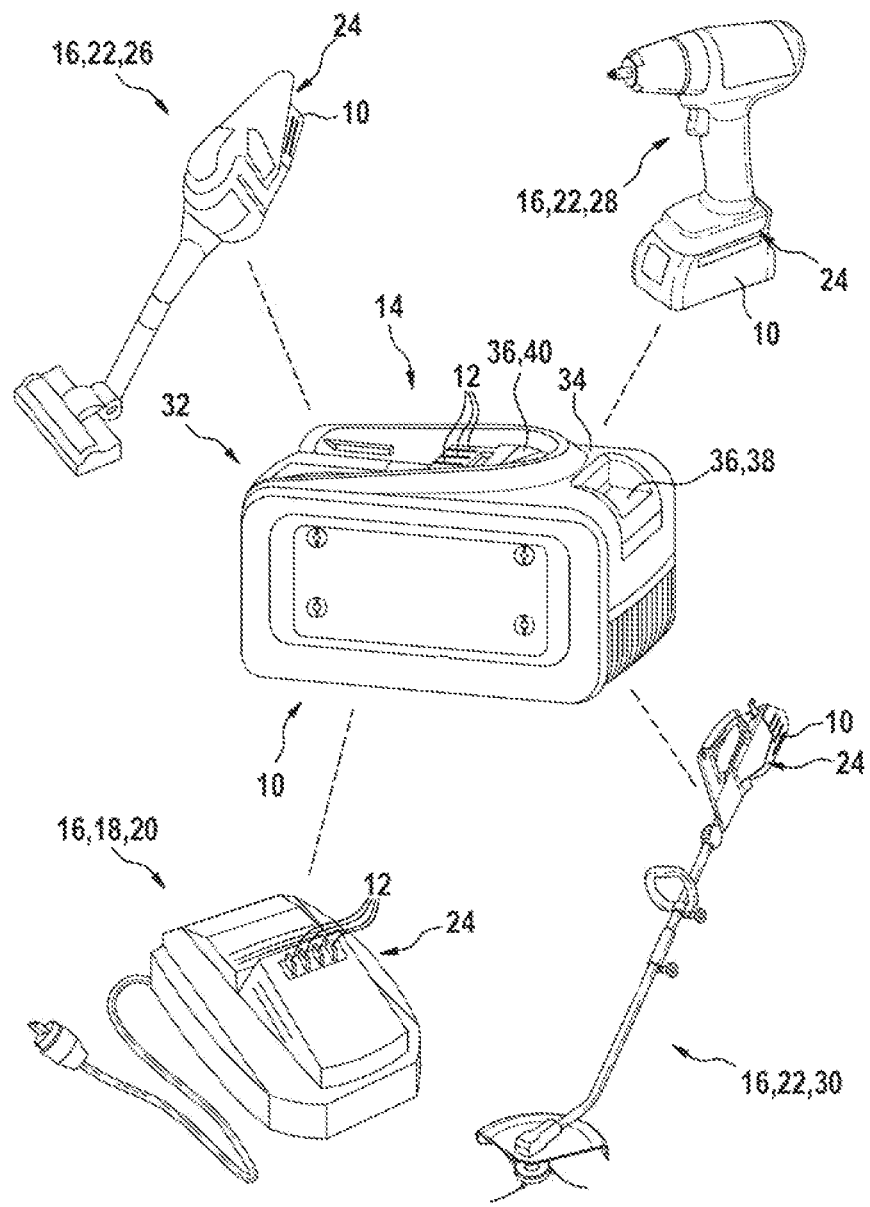
FIG. 1: shows a schematic illustration of a system comprising at least one removable battery pack and at least one electrical device that can be connected to the removable battery pack for charging or discharging the removable battery pack.

FIG. 1 shows a system comprising a removable battery pack 10 having a first electromechanical interface 14 having a plurality of electrical contacts 12 and an electrical device 16, in particular a charging device 18, a diagnostic device 20 or an electrical consumer 22, having a further electromechanical interface 24 having a plurality of electrical contacts 12. FIG. 1 is intended to illustrate that the system according to the disclosure is suitable for various electrical devices 16 operated using removable battery packs 10 without restricting the disclosure. In this case, a cordless vacuum cleaner 26, a cordless impact wrench 28 and a cordless lawn trimmer 30 are shown by way of example. In the context of the disclosure, however, a wide variety of power tools, gardening appliances and domestic appliances can be considered as electrical consumers 22. The number of removable battery packs 10 within the system can also be changed. The system can indeed also comprise several removable battery packs 10. It should furthermore be noted that, although in FIG. 1 the charging device 18 and the diagnostic device 20 are illustrated as one and the same electric device 16 because a charging device 18 can indeed also have a diagnostic function, it is conceivable, without restricting the disclosure, that the diagnostic device 20 does not have a charging function but serves only for pure diagnostics of the removable battery pack 10 for electrical fault states.

The removable battery pack 10 is essentially a conventional removable battery pack having a housing 32, which has on a first side wall or the top side 34 thereof the first electromechanical interface 14 for releasable connection to the electromechanical interface 24 of the electrical device 16. In connection with the electrical consumer 22, the first and the further electromechanical interface 14, 24 primarily serve to discharge the removable battery pack 10 while, in connection with the charging device 18, it serves to charge and, in connection with the diagnostic device 20, it serves for fault diagnosis of the removable battery pack 10. The precise configuration of the first and the further electromechanical interface 14, 24 is dependent on different factors, such as the voltage class of the removable battery pack 10 or the electrical device 16 and various manufacturer specifications, for example, It is thus possible to provide, for example, three or more electrical contacts 12 for energy and/or data transmission between the removable battery pack 10 and the electrical device 16. Mechanical coding is also conceivable, such that the removable battery pack 10 can be operated only at specific electrical devices 16. Since the mechanical configuration of the first electromechanical interface 14 of the removable battery pack and the further electromechanical interface 24 of the electrical device 16 is insignificant for the disclosure, this will not be dealt with in more detail here. Both a person skilled in the art and an operator of the removable battery pack 14 and the electrical device 16 will make the suitable selection in this regard.

The removable battery pack 10 has a mechanical arresting apparatus 36 for arresting the form-fitting and/or force-fitting detachable connection of the first electromechanical interface 14 of the removable battery pack 10 at the corresponding mating interface 24 (not shown in detail) of the electrical consumer 22. In this case, the arresting apparatus 36 is designed as a sprung pushbutton 38, which is operatively connected to an arresting member 40 of the removable battery pack 10. Due to the suspension of the pushbutton 38 and/or the arresting member 40, the arresting apparatus 36 latches into the mating interface 24 of the electrical consumer 22 when the removable battery pack 10 is inserted. If an operator presses the pushbutton 38 in the insertion direction, the arresting system is released and the operator can remove or eject the removable battery pack 10 from the electrical consumer 22 counter to the insertion direction.

As already mentioned at the beginning, the battery voltage of the removable battery pack 10 usually results from a multiple of the individual voltages of the energy storage cells (not shown) depending on the interconnection (in parallel or in series). The battery cells are preferably designed as lithium-based energy storage cells, for example Li-ion, Li—Po, Li-metal and the like. However, the disclosure can also be applied to removable battery packs with Ni—Cd, Ni-MH cells or other suitable cell types.

Figure 2:
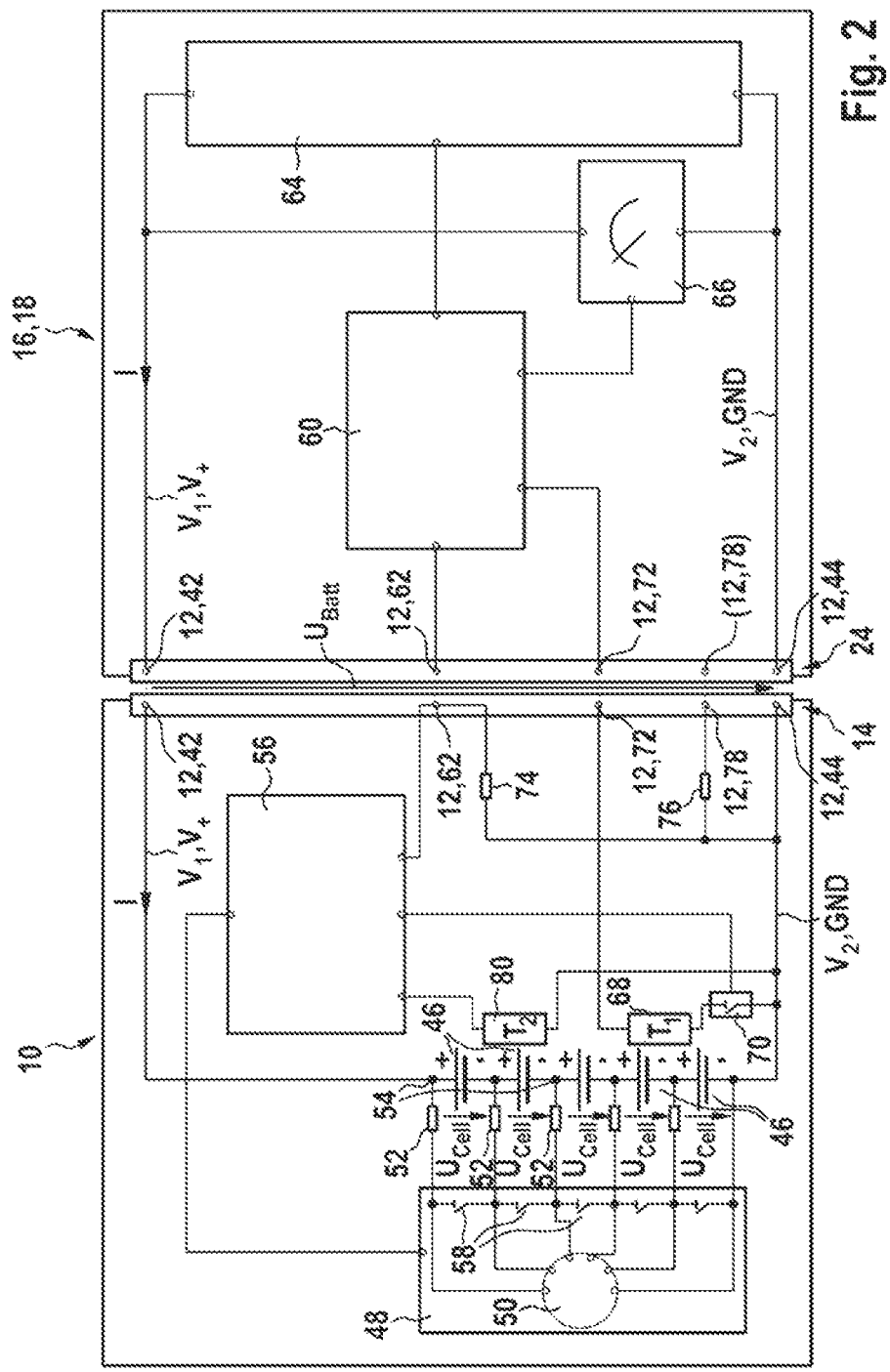
FIG. 2: shows the system from FIG. 1 as a block diagram with a removable battery pack and an electrical device designed as a charging device.

In FIG. 2, the system from FIG. 1 is illustrated in a block diagram with the removable battery pack 10 on the left-hand side and the electrical device 16 designed as a charging device 18 on the right-hand side. The removable battery pack 10 and the charging device 18 have the mutually corresponding electromechanical interfaces 14 and 24 having a plurality of electrical contacts 12, wherein in each case a first of the electrical contacts 12 of the interfaces 14, 24 serves as an energy supply contact 42 that can be supplied with a first reference potential $V_1$, preferably a supply potential $V_+$, and in each case a second of the electrical contacts 12 of the interfaces 14, 24 serves as an energy supply contact 44 that can be supplied with a second reference potential $V_2$, preferably a ground potential GND. On the one hand, the removable battery pack 10 can be charged by the charging device 18 via the first and the second energy supply contact 42, 44. On the other hand, discharge of the removable battery pack 10 is also effected via the same for the case that the electrical device 16 is designed as an electrical consumer 22. The term "can be supplied with" is intended to illustrate that the potentials $V_+$ and GND, in particular in the case of an electrical device 16 designed as an electrical consumer 22, are not permanently applied to the energy supply contacts 42, 44 but only after connection of the electrical interface 14, 24. The same applies for a discharged removable battery pack 10 after connection to the charging device 18.

The removable battery pack 10 has a plurality of energy store cells 46, which, although they are illustrated in FIG. 2 as a series circuit, they can alternatively or additionally also be operated in a parallel circuit, wherein the series circuit defines the voltage $U_{Batt}$ of the removable battery pack dropped across the energy supply contacts 42, 44, whereas a parallel circuit of individual energy storage cells 46 primarily increases the capacity of the removable battery pack 10. As already mentioned, individual cell clusters consisting of parallel-interconnected energy store cells 46 can also be connected in series in order to achieve a specific voltage $U_{Batt}$ of the removable battery pack simultaneously with an increased capacity. In current Li-ion energy storage cells 46 with a cell voltage $U_{Cell}$ of in each case 3.6 V, in the present exemplary embodiment a removable battery pack voltage $U_{Batt}=V_1-V_2$ of 5·3.6 V=18 V drops across the energy supply contacts 42, 44. Depending on the number of energy storage cells 46 connected in parallel in a cell cluster, the capacity of current removable battery packs 10 can be up to 12 Ah or more. However, the disclosure is not dependent on the type, design, voltage, current-carrying ability, etc. of the energy storage cells 46 used, but instead can be applied to any removable battery packs 10 and energy storage cells 46.

To monitor the individual series-connected energy storage cells 46 or cell clusters of the removable battery pack 10, an SCM (single cell monitoring) preliminary stage 48 is provided. The SCM preliminary stage 48 has a multiplexer measuring apparatus 50, which can be connected in a high-impedance manner to corresponding taps 54 of the poles of the energy storage cells 46 or cell clusters via filter resistors 52. To detect the individual cell voltages $U_{Cell}$, the multiplexer measuring apparatus 50 switches over sequentially between the individual tabs 54, for example by means of integrated transistors, which are not shown in more detail, in such a way that it is connected in each case to a positive and a negative pole of the energy storage cell 46 to be measured or the cell cluster to be measured. In the following text, the term energy storage cell is also intended to include the cell cluster, since these only influence the capacity of the removable battery pack 10, but are synonymous for detecting the cell voltages $U_{Cell}$. The filter resistors 52, which are configured, in particular, in a high-impedance manner, can prevent dangerous heating of the measuring inputs of the multiplexer measuring apparatus 50, in particular in the event of a fault.

The switchover of the multiplexer measuring apparatus 50 is effected by means of a first monitoring unit 56 integrated in the removable battery pack 10. Said monitoring unit can additionally close or open switching elements 58 of the SCM preliminary stage 48 that are connected in parallel with the energy storage cells 46 in order to effect what is known as balancing of the energy storage cells 46 to achieve uniform charging and discharging states of the individual energy storage cells 46. It is likewise conceivable that the SCM preliminary stage 48 passes the measured cell voltages $U_{Cell}$ directly through to the first monitoring unit 56 such that the actual measurement of the cell voltages $U_{Cell}$ is carried out directly by the first monitoring unit 56, for example by means of an appropriate analog-to-digital converter (ADC).

The first monitoring unit 56 can be designed as an integrated circuit in the form of a microprocessor, ASIC, DSP or the like. However, it is likewise conceivable that the monitoring unit 56 consists of a plurality of microprocessors or at least partly consists of discrete components with appropriate transistor logic. In addition, the first monitoring unit 56 can have a memory for storing operating parameters of the removable battery pack 10, such as, for example, the voltage $U_{Batt}$, the cell voltages $U_{Cell}$, a temperature T, a charging or discharge current I or the like.

In addition to the first monitoring unit 56 in the removable battery pack 10, the electrical device 16 of the system has a further monitoring unit 60, which can be designed correspondingly to the first monitoring unit 56. The first and the further monitoring unit 56 and 60, respectively, can exchange information, preferably digitally, via a third contact 12, designed as a signal or data contact 62, of the two electromechanical interfaces 14, 24.

The further monitoring unit 60 of the electrical device 16 designed as a charging device 18 controls a power output stage 64, which is connected to the first and the second energy supply contact 42, 44 of the further interface 24 and by means of which the removable battery pack 10 plugged into the charging device 18 can be charged using the charging current I and the voltage $U_{Batt}$ corresponding to the removable battery pack 10. For this purpose, the charging device 18 or the power output stage 64 is provided with a mains connection, which is not shown. The voltage $U_{Batt}$ applied to the energy supply contacts 42, 44 can be measured by means of a voltage measuring apparatus 66 in the charging device 18 and evaluated by the further monitoring unit 60. The voltage measuring apparatus 66 can also be integrated fully or partly in the monitoring unit 60, for example in the form of an integrated ADC.

A temperature $T_1$ of the removable battery pack 10 or the energy storage cells 46 can be measured by means of a first temperature sensor 68, which is arranged in the removable battery pack 10 and preferably designed as an NTC and in close thermal contact with at least one of the energy storage cells 46, and evaluated by the further monitoring unit 60 of the charging device 18. To this end, the first temperature sensor 68 is connected on one side to the second reference potential $V_2$, in particular to the ground potential GND, which is applied to the second energy supply contact 44 via a switching element 70, for example a bipolar transistor or MOSFET, which is integrated in the removable battery pack 10, and on the other side to a contact 12, designed as a signal or data contact 72, of the first interface 14 of the removable battery pack 10.

A signal or data contact 72 is accordingly provided in the further interface 24 of the charging device 18, said contact being connected to the further monitoring unit 60. Furthermore, a connection, which is not shown, can also exist between the signal or data contact 72 of the first interface 14 of the removable battery pack 10 and the first monitoring unit 56 of the removable battery pack 10. Via said connection, the first monitoring unit 56 could determine whether the temperature $T_1$ measured by the first temperature sensor 68 has been requested by the further monitoring unit 60 of the charging device 18. If this were the case, the first monitoring unit 56 could be transferred automatically from a quiescent mode to an operating mode. If there had been no such request, the quiescent mode could allow the monitoring unit 56 significantly longer idle and storage times of the removable battery pack 10 due to the reduced quiescent current.

In order that the charging device 18 can identify the removable battery pack 10 and, if necessary, enable it for charging, the removable battery pack 10 has a first coding resistor 74, which is connected on one side to the second reference potential $V_2$, in particular to the ground potential GND, which is applied to the second energy supply contact 44 and on the other side to the third contact 12, designed as a signal or data contact 62, of the first interface 14 of the removable battery pack 10. If the resistance value of the first coding resistor 74 corresponds to a value stored in the further monitoring unit 56 of the charging device 60, the charging device 18 enables the charging process and charges the removable battery pack 10 according to the charging parameters stored in a look-up table, in particular the charging current I, the charging voltage $U_{Batt}$, the permissible temperature range, etc. In addition to the first coding resistor 74, a second coding resistor 76 is provided in the removable battery pack 10, said second coding resistor being connected, in a manner corresponding to the first coding resistor 74, to the second reference potential $V_2$ and a further contact 12, designed as a signal or data contact 78, of the first interface 14 of the removable battery pack 10. An electrical device 16 designed as an electrical consumer 22 can enable the discharge process of the removable battery pack 10 by means of the second coding resistor 76. To this end, analogously to the charging device 18, the electrical consumer 22 has a further monitoring unit 60, which requests the resistance value of the second coding resistor 76 by means of a contact 12, designed as a signal or data contact 78, of the further interface 24 and compares it with a stored value. If the values do not correspond, the discharging process of the removable battery pack 10 is terminated or not permitted, with the result that the electrical consumer 22 cannot be set into operation. When they correspond, an operator can set the electrical consumer 22 into operation. This advantageously allows operation of removable battery packs 10 of different power classes with identical electromechanical interfaces 14 or 24. It is self-evident that, in the case of an electrical consumer 22, the power output stage 64 contained in the charging device 18 is designed as a drive unit, for example as an electric motor (possibly with power output stage accordingly connected upstream) or another unit that consumes energy. The configuration of such a unit will not be dealt with further here since it is well known to a person skilled in the art for a wide variety of types of electrical consumers 22 and also does not have any critical importance for the disclosure.

The removable battery pack 10 has at least one further temperature sensor 80, which is connected to the first monitoring unit 56. The further temperature sensor 80 is used to monitor the at least one energy storage cell 46 and/or further energy storage cells 46 that are electrically connected to the at least one energy storage cell 46. To this end, the temperature $T_2$ measured by the further temperature sensor 80 is evaluated accordingly by the first monitoring unit 56 and the charging or discharging process is influenced according to the method described below in conjunction with the temperature $T_1$ measured by the first temperature sensor 68.

Figure 3:
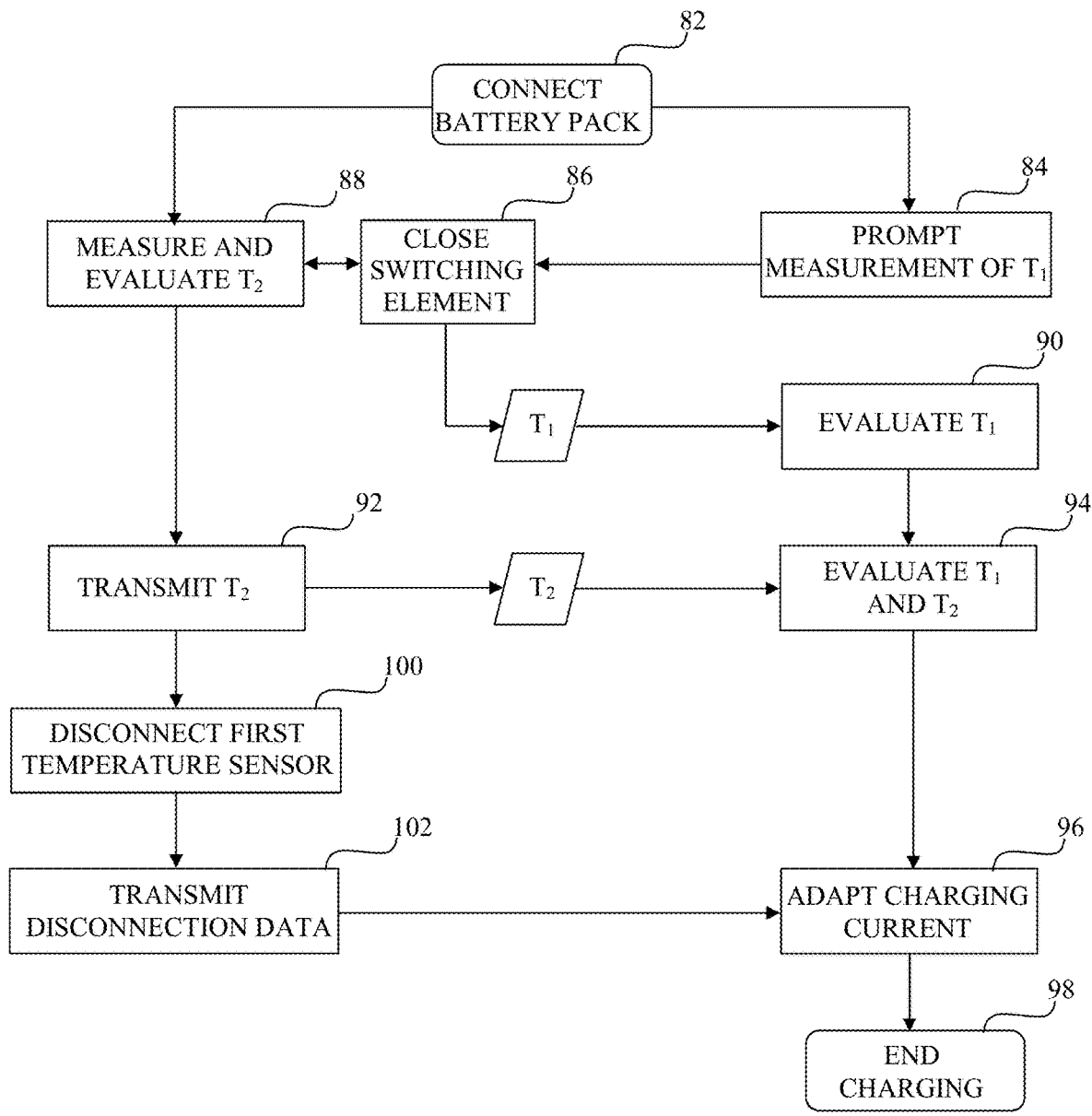
FIG. 3: shows a flowchart of the method according to the disclosure.

FIG. 3 shows a flowchart of the method according to the disclosure that can be carried out using the system described in FIG. 2. In a first method step 82 of the method, the removable battery pack 10 is connected via its first electromechanical interface 14 to the further electromechanical interface 24 of the electrical device 16. In the following text, it is to be assumed that the electrical device 16 is designed as a charging device 18 according to FIG. 2. However, the method can likewise be carried out using a system in which the electrical device 16 is designed as an electrical consumer 22 or as a diagnostic device 20.

For the purpose of better clarity, the method steps illustrated on the left-hand side of the flowchart are carried out in the removable battery pack 10 and the method steps illustrated on the right-hand side are carried out in the charging device 18.

In method step 84, the further monitoring unit 60 of the charging device 18 prompts the measurement of the temperature $T_1$ of the removable battery pack 10 via the contacts 12, designed as signal or data contact 72, of the interfaces 14, 24, or of the energy storage cells 46 by means of the first temperature sensor 68 when the switching element 70 is closed in method step 86. Essentially simultaneously, the temperature $T_2$ of the removable battery pack 10 or of the energy storage cells 46 is measured by means of the second temperature sensor 80 in method step 88 and evaluated by the first monitoring unit 56 of the removable battery pack 10. In the subsequent method step 90, the temperature $T_1$ measured by the first temperature sensor 68 is evaluated by the further monitoring unit 60.

In method step 92, the first monitoring unit 56 of the removable battery pack 10 transmits the temperature $T_2$ evaluated by same in method step 88 to the second monitoring unit 60 of the electrical device 16 via the contacts 12, designed as signal or data contact 62, of the interface 14, 24.

In the subsequent method step 94, the second monitoring unit evaluates the temperature values $T_1$, $T_2$ and where necessary adapts the charging current I of the removable battery pack 10 in method step 96 in such a way that the specifications of the energy storage cells 46 can be complied with. If the specifications cannot be complied with, the charging process is interrupted or ended in method step 98. If the two evaluated temperature values $T_1$, $T_2$ differ, the charging current I is adjusted according to the temperature value $T_1$ or $T_2$ for which the respectively lower charging current I is permissible or for which the charging process in method step 98 has to be ended. As an alternative or in addition, the charging process of the removable battery pack 10 is interrupted and/or a fault state is displayed in method step 98 when the evaluated temperature values $T_1$, $T_2$ in method step 96 differ by more than a first temperature threshold value $T_{S1}$, in particular by more than 10 kelvin.

In a method step 100, which can proceed in parallel or sequentially with method steps 94 and 96, the first monitoring unit 56 disconnects the first temperature sensor 68 from the second reference potential $V_2$, in particular the ground potential GND, via the switching element 70 integrated in the removable battery pack 10 when the measured temperature $T_2$ of the second temperature sensor 80 has exceeded a further temperature threshold value $T_{S2}$, in particular 60° C. The deactivation of the first temperature sensor 68 can be detected by the further monitoring unit 60 in the charging device 16 directly via the signal or data contact 72, the result that it terminates or interrupts the charging process of the removable battery pack 10 and/or displays a corresponding fault state on the charging device 18.

In a subsequent method step 102, a piece of information about the disconnection of the first temperature sensor 68 from the second reference potential $V_2$ is transmitted by the first monitoring unit 56 to the further monitoring unit 60 of the electrical device 16, whereupon the further monitoring unit 60 terminates or interrupts the charging process of the removable battery pack 10 in method step 98 and/or displays a corresponding fault state on the charging device 18. To this end, the charging device 18 has a corresponding display, which is not shown in more detail, in the form of an LED, a display screen and/or optical signal generator. If the electrical device 18 is designed as a diagnostic device 20 or an electrical consumer 22, the display can additionally or alternatively also be designed as a haptic signal generator, for example in the form of a vibration motor. In the case of an electrical consumer 22 driven by electric motor, it is also conceivable that a drive motor for an insert tool serves as haptic and/or acoustic signal generator.

Finally, it should be pointed out that the exemplary embodiments shown are not restricted either to FIGS. 1 to 3 nor to the number and type of removable battery packs 10 and electrical devices 16 shown therein. The same applies to the number of energy storage cells 46. The configurations of the interfaces 14, 24 and the number of contacts 12 thereof shown should be understood as purely exemplary.

What is claimed is:

1. A method for detecting an electrical fault state of at least one energy storage cell of a removable battery pack, comprising:

coupling the removable battery pack with an electrical device configured to be electrically connected to the removable battery pack;

evaluating a first measured temperature value of the at least one energy storage cell measured by a first temperature sensor integrated in the removable battery pack using a first monitoring unit integrated in the electrical device with the removable battery pack and electrical device coupled; and essentially simultaneously evaluating a second measured temperature value of the at least one energy storage cell measured by a second temperature sensor integrated in the removable battery pack using a second monitoring unit integrated in the removable battery pack with the removable battery pack and electrical device coupled; and adapting a charging or discharge current of the removable battery pack based on the evaluation of the first and the second measured temperature values.

2. The method according to claim 1, further comprising:
transmitting the second measured temperature value evaluated using the first second monitoring unit of the removable battery pack to the first monitoring unit of the electrical device.

3. The method according to claim 2, further comprising:
evaluating the first and the second measured temperature values using the first monitoring unit; and
adapting the charging or discharge current of the removable battery pack based on the evaluation, using the first monitoring unit, of the first and the second measured temperature values.

4. The method according to claim 3, wherein adapting the charging or discharge current comprises:
adapting the charging or discharge current of the removable battery pack based on the evaluated first and second measured temperature value using the first monitoring unit which results in a lower charging or discharge current.

5. The method according to claim 3, further comprising:
interrupting a charging or discharging process of the removable battery pack and/or displaying an identification of the electrical fault state when the evaluated first and second measured temperature values differ by more than a temperature threshold value.

6. The method according to claim 1, further comprising:
disconnecting the second temperature sensor from a reference potential using the second monitoring unit via a switching element integrated in the removable battery pack when the first measured temperature value exceeds a temperature threshold value.

7. The method according to claim 6, further comprising:
transmitting a piece of information about the disconnection of the second temperature sensor from the second monitoring unit to the first monitoring unit; and
terminating or interrupting a charging or discharging process of the removable battery pack using the first monitoring unit and/or displaying an identification of the electrical fault state.

8. A system comprising:
an electrical device including a first monitoring unit and a first electromechanical interface having a first plurality of electrical contacts; and
a removable battery pack including (i) a second monitoring unit, (ii) at least two temperature sensors, (iii) a second electromechanical interface having a second plurality of electrical contacts, and (iv) at least one energy storage cell,
wherein in each of the first and the second plurality of electrical contacts (i) a first electrical contact is configured as an energy supply contact that can be supplied with a first reference potential, (ii) a second electrical contact is configured as an energy supply contact that can be supplied with a second reference potential, (iii) a third electrical contact is configured as a signal or data contact for data exchange between the first and the second monitoring units, and (iv) a fourth electrical contact is configured as a signal or data contact for transmitting a temperature signal of a corresponding one of the first and the second temperature sensors to the first monitoring unit, and wherein the system is configured to detect an electrical fault state of the at least one energy storage cell, the system configured to:
evaluate, in the electrical device, a first measured temperature value of the at least one energy storage cell measured by a first temperature sensor of the at least two temperature sensors using the first monitoring unit with the first electromechanical interface coupled with the second electromechanical interface; and
essentially simultaneously, in the removable battery pack, evaluate a second measured temperature value of the at least one energy storage cell measured by a second temperature sensor of the at least two temperature sensors using the second monitoring unit with the first electromechanical interface coupled with the second electromechanical interface.

9. The system according to claim 8, wherein:
the removable battery pack further includes a switching element configurable in a closed state and an open state,
in the closed state of the switching element, the switching element is configured to connect the second temperature sensor to the second reference potential of the second energy supply contact, and
in the open state of the switching element, the switching element is configured to disconnect the second temperature sensor from the second reference potential.

10. A removable battery pack comprising:
at least one energy storage cell;
a monitoring unit;
a first temperature sensor;
a second temperature sensor operably connected to the monitoring unit; and
an electromechanical interface having a plurality of electrical contacts configured for connection to an electrical device,
wherein the plurality of electrical contacts includes (i) a first electrical contact configured as an energy supply contact that can be supplied with a first reference potential, (ii) a second electrical contact configured as an energy supply contact that can be supplied with a second reference potential, (iii) a third electrical contact configured as a signal or data contact of the monitoring unit, and (iv) a fourth electrical contact configured to monitor the at least one energy storage cell and configured as a signal or data contact of the first temperature sensor, and
wherein the monitoring unit cannot obtain a measured temperature value using the first temperature sensor.

11. The removable battery pack according to claim 10, further comprising:
a third temperature sensor configured to monitor the at least one energy storage cell and/or further energy storage cells that are electrically connected to the at least one energy storage cell.

12. The removable battery pack according to claim 10, further comprising:

a switching element operably connected to the first temperature sensor and configurable in a closed state and an open state, wherein the monitoring unit is configured to control the switching element, wherein in the closed state of the switching element, the switching element is configured to connect the first temperature sensor to the second reference potential of the second energy supply contact, and wherein in the open state of the switching element, the switching element is configured to disconnect the first temperature sensor from the second energy supply contact.

* * * * *

UNITED STATES PATENT AND TRADEMARK OFFICE
CERTIFICATE OF CORRECTION

| | |
|---|---|
| PATENT NO. | : 12,301,032 B2 |
| APPLICATION NO. | : 17/382740 |
| DATED | : May 13, 2025 |
| INVENTOR(S) | : Osswald et al. |

Page 1 of 1

It is certified that error appears in the above-identified patent and that said Letters Patent is hereby corrected as shown below:

In the Claims

In Claim 2, at Column 11, Line 19: "the first second monitoring unit" should read --the second monitoring unit--.

Signed and Sealed this
Seventh Day of October, 2025

John A. Squires
*Director of the United States Patent and Trademark Office*